(12) United States Patent
Cahill et al.

(10) Patent No.: US 9,812,420 B2
(45) Date of Patent: Nov. 7, 2017

(54) DIE PACKAGING WITH FULLY OR PARTIALLY FUSED DIELECTRIC LEADS

(71) Applicant: ROSENBERGER HOCHFREQUENZTECHNIK GMBH & CO. KG, Fridolfing (DE)

(72) Inventors: Sean S. Cahill, Santa Clara, CA (US); Eric A. Sanjuan, Santa Clara, CA (US)

(73) Assignee: ROSENBERGER HOCHFREQUENZTECHNIK GMBH & CO. KG, Fridolfing (DE)

( * ) Notice: Subject to any disclaimer, the term of this patent is extended or adjusted under 35 U.S.C. 154(b) by 0 days.

(21) Appl. No.: 14/902,504

(22) PCT Filed: Jul. 2, 2014

(86) PCT No.: PCT/EP2014/001823
§ 371 (c)(1),
(2) Date: Dec. 31, 2015

(87) PCT Pub. No.: WO2015/000594
PCT Pub. Date: Jan. 8, 2015

(65) Prior Publication Data
US 2016/0379952 A1    Dec. 29, 2016

Related U.S. Application Data

(60) Provisional application No. 61/842,948, filed on Jul. 3, 2013, provisional application No. 61/842,949, filed
(Continued)

(51) Int. Cl.
*H01L 23/48* (2006.01)
*H01L 23/00* (2006.01)
(Continued)

(52) U.S. Cl.
CPC ............ *H01L 24/45* (2013.01); *H01L 23/367* (2013.01); *H01L 23/66* (2013.01); *H01L 24/48* (2013.01);
(Continued)

(58) Field of Classification Search
CPC ....................................................... H01L 24/45
(Continued)

(56) References Cited

U.S. PATENT DOCUMENTS 6,956,283 B1 * 10/2005 Peterson ............... B81B 7/0025
257/680
7,969,022 B1    6/2011 Liu
(Continued)

FOREIGN PATENT DOCUMENTS

JP    2008167036 A    7/2008
TW    201316477 A    4/2013

*Primary Examiner* — Jami M Valentine
(74) *Attorney, Agent, or Firm* — DeLio, Peterson & Curcio, LLC; Robert Curcio (57) ABSTRACT

A die interconnect system having a first die with a plurality of connection pads, and a ribbon lead extending from the first die, the ribbon lead having a plurality of metal cores with a core diameter, and a dielectric layer surrounding the metal core with a dielectric thickness, with at least a portion of dielectric being fused between adjacent metal cores along the length of the plurality of metal cores, and an outer metal layer attached to ground.

18 Claims, 10 Drawing Sheets

Related U.S. Application Data on Jul. 3, 2013, provisional application No. 61/842,954, filed on Jul. 3, 2013.

(51) Int. Cl.

| | | |
|---|---|---|
| *H01L 23/66* | (2006.01) | |
| *H01L 25/10* | (2006.01) | |
| *H01Q 23/00* | (2006.01) | |
| *H01L 23/367* | (2006.01) | |
| *H01Q 1/28* | (2006.01) | |
| *H01L 25/065* | (2006.01) | |

(52) U.S. Cl.
CPC .............. *H01L 24/49* (2013.01); *H01L 24/97* (2013.01); *H01L 25/0652* (2013.01); *H01L 25/0655* (2013.01); *H01L 25/105* (2013.01); *H01Q 1/283* (2013.01); *H01Q 23/00* (2013.01); *H01L 2223/6611* (2013.01); *H01L 2223/6677* (2013.01); *H01L 2224/45014* (2013.01); *H01L 2224/4569* (2013.01); *H01L 2224/45565* (2013.01); *H01L 2224/48091* (2013.01); *H01L 2224/48137* (2013.01); *H01L 2224/48145* (2013.01); *H01L 2224/48147* (2013.01); *H01L 2224/48195* (2013.01); *H01L 2224/48227* (2013.01); *H01L 2224/48247* (2013.01); *H01L 2224/4903* (2013.01); *H01L 2224/49109* (2013.01); *H01L 2224/73265* (2013.01); *H01L 2224/8592* (2013.01); *H01L 2224/85444* (2013.01); *H01L 2224/85935* (2013.01); *H01L 2224/85939* (2013.01); *H01L 2225/06506* (2013.01); *H01L 2225/06537* (2013.01); *H01L 2225/06555* (2013.01); *H01L 2225/06582* (2013.01); *H01L 2225/06589* (2013.01); *H01L 2225/1052* (2013.01); *H01L 2225/1094* (2013.01); *H01L 2924/00014* (2013.01); *H01L 2924/15311* (2013.01); *H01L 2924/181* (2013.01); *H01L 2924/19107* (2013.01); *H01L 2924/3025* (2013.01)

(58) Field of Classification Search
USPC ........................................................ 257/777
See application file for complete search history.

(56) References Cited

U.S. PATENT DOCUMENTS

| | | | |
|---|---|---|---|
| 8,377,749 | B1 | 2/2013 | Patterson |
| 2002/0006526 | A1* | 1/2002 | Polese ................ C07J 1/00 |
| | | | 428/654 |
| 2003/0090001 | A1 | 5/2003 | Beatson |
| 2003/0159262 | A1 | 8/2003 | Pasternak |
| 2005/0156322 | A1* | 7/2005 | Smith ................ H01L 25/0657 |
| | | | 257/778 |
| 2007/0023921 | A1 | 2/2007 | Zingher |
| 2008/0296780 | A1 | 12/2008 | Yoo |
| 2009/0159320 | A1 | 6/2009 | Sanjuan |
| 2010/0019391 | A1 | 1/2010 | Strzalkowski |
| 2010/0258952 | A1 | 10/2010 | Fjelstad |
| 2015/0257263 | A1* | 9/2015 | Sethumadhavan .. H05K 1/0366 |
| | | | 257/88 |
| 2016/0379911 | A1* | 12/2016 | Cahili ................ H01L 23/3737 |
| | | | 257/706 |

* cited by examiner

Fig. 15

DIE PACKAGING WITH FULLY OR PARTIALLY FUSED DIELECTRIC LEADS

BACKGROUND OF THE INVENTION

1. Field of the Invention

The present invention relates to improved die-to-die or die-to-substrate interconnects, including both discrete and same package die. Further, the present invention relates to through lines for improved interconnection between sources and loads with differing impedance.

Further, heat transfer interconnect structures that promote heat transfer away from a die are described. Such interconnect structures are of particular use in multi-die and stacked die packages.

2. Description of Related Art

BACKGROUND

Electronic devices and components are operating at ever increasing speeds and over increasing frequency ranges. Popular semiconductor package types use wire bonds that can connect to a substrate or leadframe, which in turn can connect to second level interconnects, vias, substrate or package traces, solder balls, or the like, for connection to a printed circuit board (PCB) of an electronic device.

However, leads might not have suitable mechanical properties, including rigidity and strength. In other embodiments, die pitch restrictions might not allow distinct leads coated by a non-overlapping dielectric layers, particularly when the dielectric layers are thick.

Further, conventional package leads might not be optimized for particular electrical characteristics including interconnects between sources and loads with differing impedance.

Additionally, as speed increases, so does power requirements and the need to transfer waste heat away from the die. This is a particular problem for stacked die, interior die in a stack being effectively insulated on top and bottom by substrate materials or other heat generating die.

SUMMARY OF THE INVENTION

Bearing in mind the problems and deficiencies of the prior art, it is therefore an object of the present invention to provide an interconnect system for interconnecting semiconductor die packages with at least one die, the system having improved mechanical properties of connection leads with minimal impact on electrical characteristics.

Mechanical properties of leads for die packages are can be improved by fusion of dielectric layers into metal coated ribbons, with minimal impact on electrical characteristics.

The above and other objects, which will be apparent to those skilled in the art, are achieved in the present invention which is directed to an interconnect system for interconnecting semiconductor die packages, comprising a first die having a plurality of connection pads, and a ribbon lead extending from the first die, the ribbon lead having a plurality of metal cores with a core diameter, and a dielectric layer surrounding the metal cores with a dielectric thickness, with at least a portion of dielectric being fused between adjacent metal cores along the length of the plurality of metal cores, and an outer metal layer attached to ground.

According to the invention, mechanical properties of leads for die packages can be improved by fusion of dielectric layers into metal coated ribbons, with minimal impact on electrical characteristics.

Further, through lines can be created by partial or full fusion of dielectric layers into partially or fully coated metal ribbons. This allows for improved interconnect between sources and loads with differing impedance, as well as better signal transfer characteristics to package or substrate mounted antenna, including patch antennas.

Further, heat transfer ribbon interconnect structures may promote heat transfer away from a die. Such ribbon interconnect structures are of particular use in multi-die and stacked die packages.

The interconnect system may be a multi-die interconnect system comprising a first die and a second die, with each die respectively having a plurality of connection pads, the ribbon lead extending from the first die to the second die.

The interconnect system may be a through line interconnect system comprising a first die and a second die, with each die respectively having a plurality of connection pads, the ribbon lead extending from the first die to the second die.

The interconnect system may be a through line interconnect system with a package substrate having a plurality of connection pads, the ribbon lead extending from the package substrate to the first die.

The outer metal layer may be exposed to ambient conditions to facilitate heat transfer. Additionally or alternatively, the ribbon lead may extend from the first die to a heat sink.

The dependent claims relate to advantageous embodiments of the invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-15 of the drawings in which like numerals refer to like features of the invention.

Figure 1:
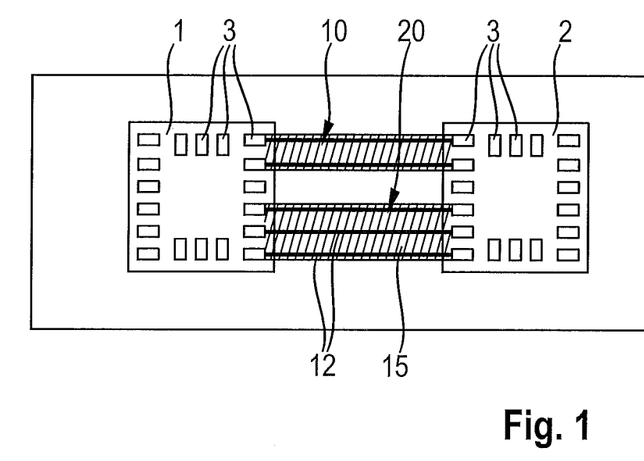
FIG. 1 is an illustration of a die to die interconnect structure formed from dielectric and metal coated leads consolidated into ribbons for improved mechanical performance and acceptable electrical characteristics.

As seen in FIG. 1, ribbon leads suitable for interconnecting semiconductor die packages can be formed from leads having dielectric coated metal cores, with the dielectric coating completely or partially fused along the length of the lead. The dielectric coating is covered with outer ground connected metallization to provide the desired electrical characteristics while also improving mechanical characteristics and resistance to polymer degradation through oxidation or other chemical effects. As seen with respect to FIG. 1, first and second die 1, 2 respectively having connection pads 3 are interconnected by two separate ribbons 10, 20 composed of fused dielectric coating 15 that is encapsulated with metal. The process of forming a ribbon interconnect begins with attachment of a metal core 12 of a lead to die and substrate connection pads 3. The metal core 12 is coated with a dielectric 15 and metallized, with the metal being connected to a ground (possibly requiring a separate laser ablation or other step of dielectric removal to allow access to ground connection pads). For cavity packages, the die can be fitted with a hermetic lid or other cover. Otherwise the die can be covered with a mold compound, an epoxy glob top, or other suitable encapsulant material, separately (with the ribbon lead(s) extending out of the encapsulating material, or together in one multi-die package as required.

Figure 2:
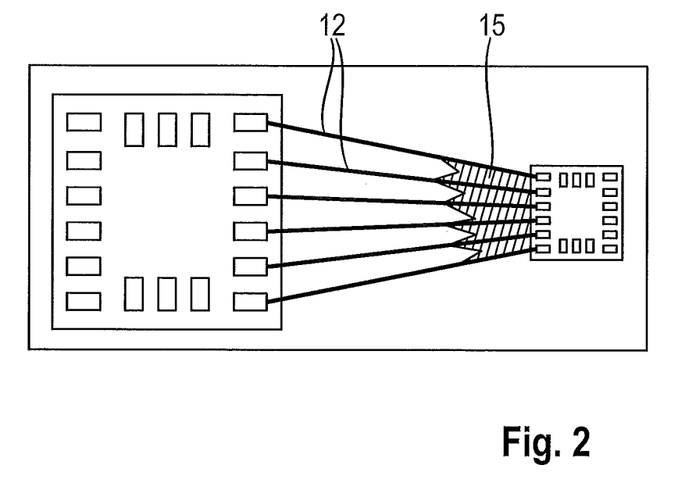
FIG. 2 is an illustration of a large die to small die interconnect structure formed from dielectric and metal coated leads, with the leads consolidated into ribbons for at least a portion of their length due to reduced pitch of the smaller die.

As seen in FIG. 2, ribbon leads suitable for interconnecting semiconductor die packages can be formed from leads having dielectric coated metal cores 12, with the dielectric coating 15 only partially fused along the length of the lead. In FIG. 2, the smaller pitch of the smaller die results in fusion of dielectric material near the small die. This can reduce uniformity of electrical characteristics as compared to distinct and separated leads, since the electrical environment of edge leads is substantially different than interior leads, but the variation is minimal if only a limited length of the lead near the smaller die has fused dielectric.

Figure 3:
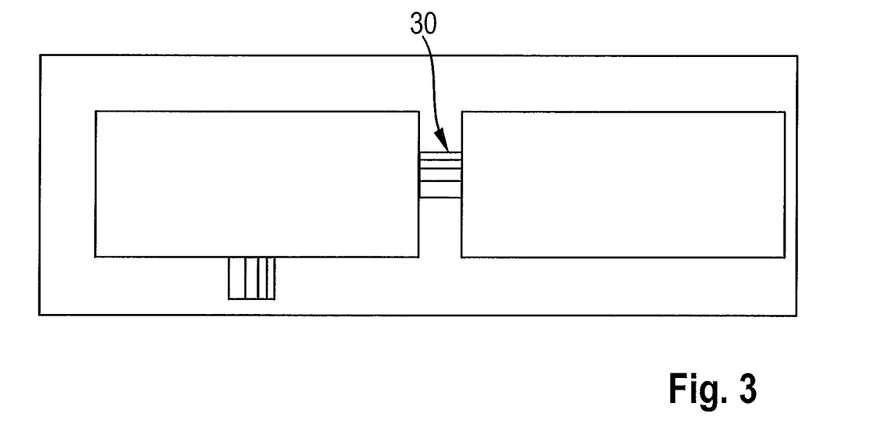
FIGS. 3 and 4 respectively illustrate in plan and side view both package to package and die to die interconnect with ribbon leads.
Figure 4:
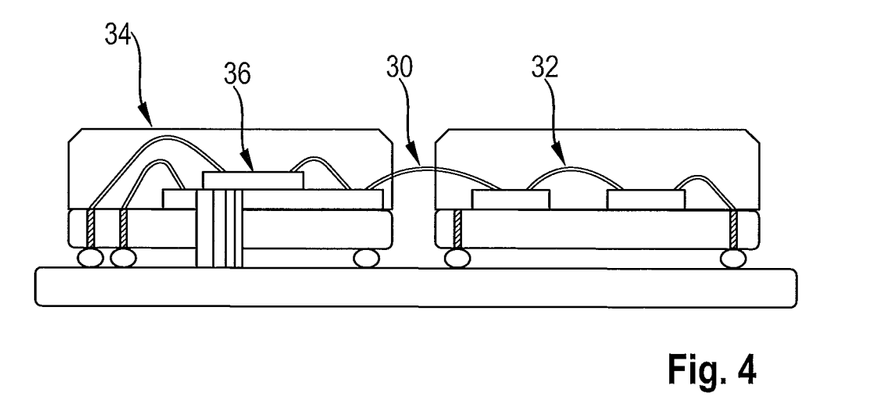

FIGS. 3 and 4 respectively illustrate in plan and side view a package-to-package connection using a ribbon lead 30 as discussed with respect to FIG. 1, as well as a die to die interconnection 32 in a common mold package, and a die-to-substrate ribbon connection 34. As can be seen in FIG. 4, stacked packages 36 are also supported, with ribbons extending between stacked die being shown.

In the following, the embodiments of the invention shown in FIGS. 9 to 11 will be described. Partially metallized ribbon leads suitable for interconnecting semiconductor die or other active or passive elements, including antenna, can be formed from leads having dielectric coated metal cores, with the dielectric coating completely or partially fused along the length of the lead. The dielectric coating is only partially covered with outer ground connected metallization to provide the desired through line electrical characteristics. The process of forming a ribbon interconnect begins with attachment of a metal core of a lead to die and substrate connection pads. The metal core is coated with a dielectric and metallized, with the metal being connected to a ground (possibly requiring a separate laser ablation or other step of dielectric removal to allow access to ground connection pads).

Figure 9:
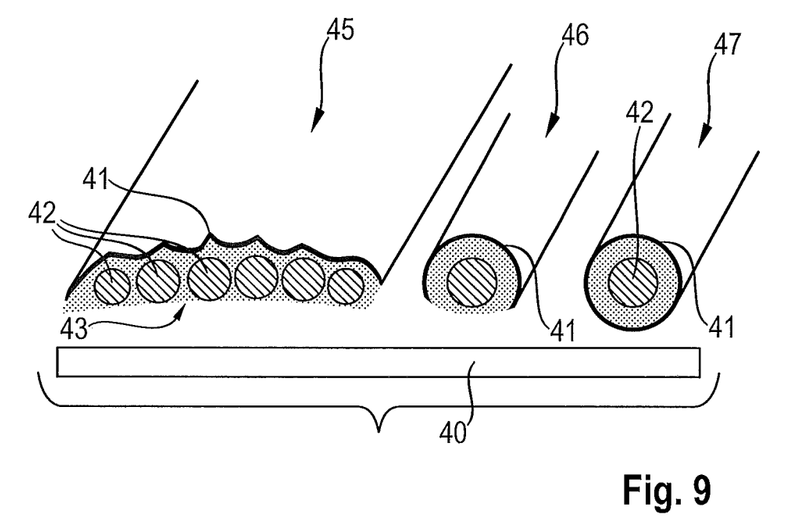
FIG. 9 is an illustration of structures and methods for forming dielectric and partially or fully metal coated leads optimized for interconnect requirements.

As seen in FIG. 9, leads 45, 46, 47 suitable for a semiconductor die package are positionable over a substrate 40, and can be formed from dielectric coated metal cores 42, with outer ground connected metallization 41. As seen with respect to FIG. 9, a non-uniform (or uniform in certain embodiments) dielectric coating can be selectively metallized to adjust electrical characteristics, including impedance. Selected partial metallization can occur with a single lead, groups of leads, or all leads in a package, as needed. In FIG. 9 a collection of partially metallized, fused dielectric ribbon 43 surrounding metal cores 42 is shown, as well as a single partially metallized lead 46 and a uniformly dielectric and metallized lead 47, all connectable to the same die. The partial through line leads can connect to other die, to substrate 40 supported connection pads, or to other active or passive devices, including patch or other antenna. In some embodiments, a single lead can define a through line to an antenna system, including but not limited to an antenna launch. In effect, a lead 45, 46 having metal reduced or removed entirely along some portion of the lead length, typically the underside of the lead adjacent to the substrate 40, is formed to selectively modify electrical characteristics of the lead.

Figure 10:
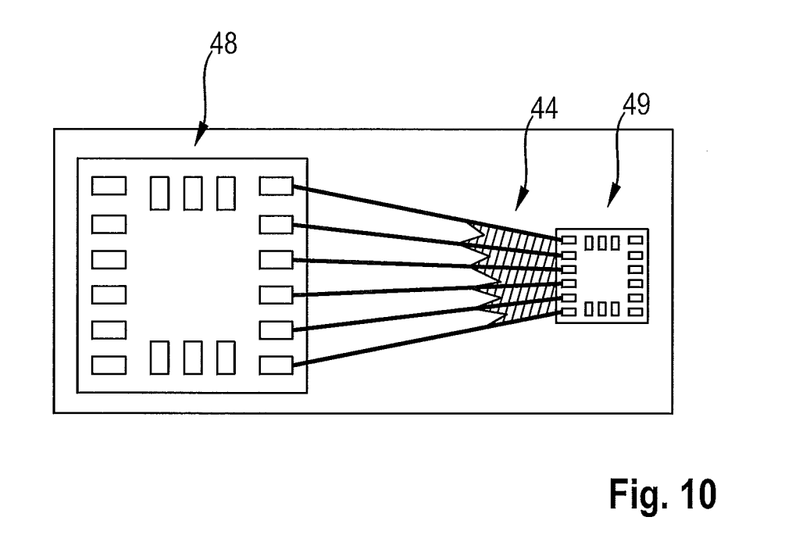
FIG. 10 illustrates in plan view two die interconnected by fully metallized dielectric coated leads merging into a partially metallized through line.

FIG. 10 illustrates in plan view two dies 48, 49 interconnected by fully metallized dielectric coated leads merging into a partially metallized through line. Near the smaller die 49, the fused dielectric 44 shadows the lower side (positioned near the substrate) during metallization, resulting in an interconnect that has, completely separate and fully metallized for ground connection, leads near the larger die, and a fused and partially metallized through line near the smaller die. As will be appreciated, through line interconnection to stacked die or packages is also possible.

Figure 11:
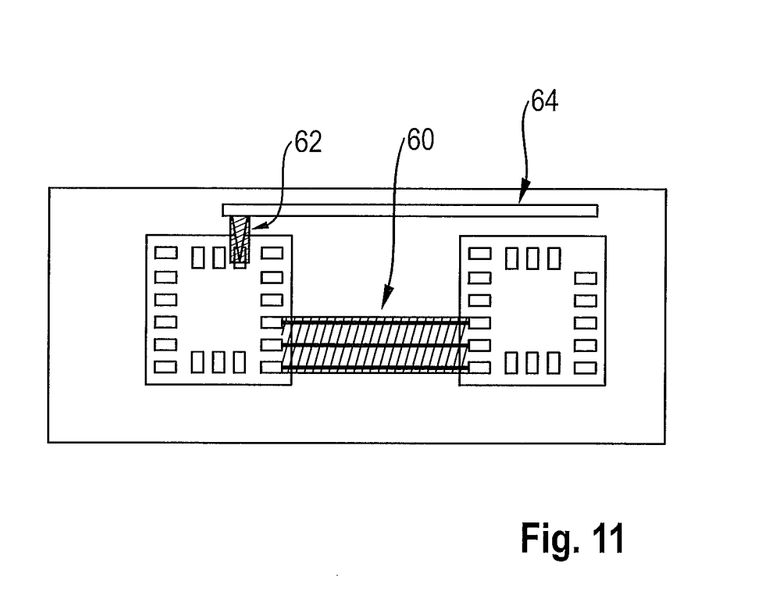
FIG. 11 illustrates a packaged die to die through line interconnect, and a separate through line interconnect to a substrate mounted antenna.

FIG. 11 illustrates a packaged die to die through line interconnect 60, and a separate through line interconnect 62 to a substrate mounted antenna 64. Through line connections 62 to antenna 64 can be advantageous to provide an intermediate impedance connection between a low source and a high antenna.

Figure 12:
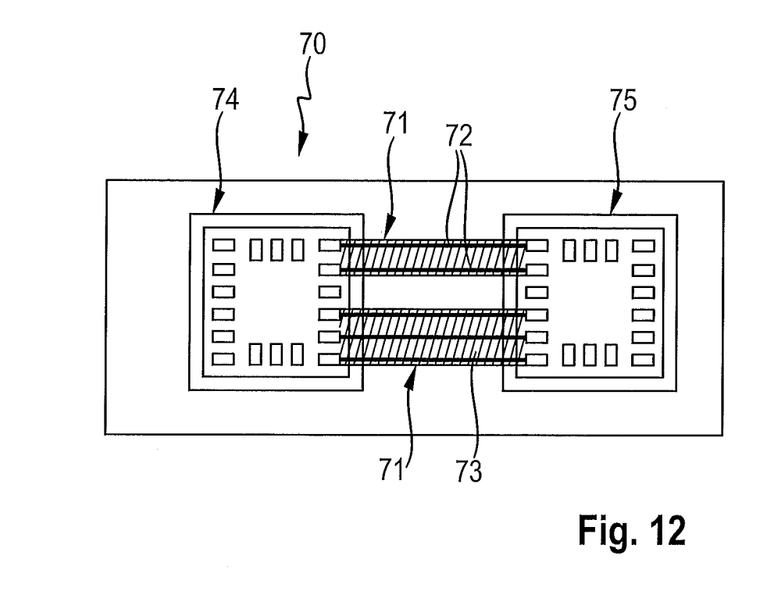
FIG. 12 is an illustration of a die to die interconnect structure formed from dielectric and metal coated leads consolidated into ribbons and exposed outside of a package for improved thermal transfer performance.

In the following, in particular the embodiments of the invention shown in FIGS. 12 to 15 will be described. As seen in FIG. 12, one or more high thermal conductivity leads suitable for interconnecting semiconductor die packages 70 can be formed from leads 71 having dielectric coated metal cores 72, with the dielectric coating completely, partially, or unfused along the length of the lead 71. Embodiments with full or partial fusion of dielectric can be characterized as "ribbon" leads 71, while unfused leads can be referred to as a lead or single lead. The ribbon or single leads can extend outside the package 70 into ambient air help transfer heat away from the package. Alternatively, the leads can be convectively or contact cooled by suitable active or passive thermal heat sinks, including moving air or liquid, high thermal conductivity metal or other heat sinks, thermal pastes or thermally transmissive adhesives, or active cooling agents such as piezoelectric coolers.

The dielectric coating 73 is covered with outer ground connected metallization that provides desired thermal and electrical characteristics while also improving mechanical characteristics and resistance to polymer degradation through oxidation or other chemical effects. As seen with respect to FIG. 12, first and second die 74, 75 respectively having connection pads are interconnected by two separate ribbons 71 composed of fused dielectric coating 73 that is encapsulated with metal. The process of forming a ribbon interconnect begins with attachment of a metal core 72 of a lead to die substrate connection pads. The metal core 72 is coated with a dielectric 73 and metallized, with the metal being connected to a ground (possibly requiring a separate laser ablation or other step of dielectric removal to allow access to ground connection pads). For cavity packages, the die can be fitted with a hermetic lid or other cover. Otherwise the die can be covered with a mold compound, an epoxy glob top, or other suitable encapsulant material, separately with the ribbon lead(s) extending out of the encapsulating material, or together in one multi-die package as required. In certain embodiments, titanium tungsten (TiW) or other metals or metal stacks with superior adhesion properties can be used to overcoat previously deposited metal prior to encapsulation. For example, a ground plane metallization may include a TiW—Cu—TiW metal stack.

Figure 13:
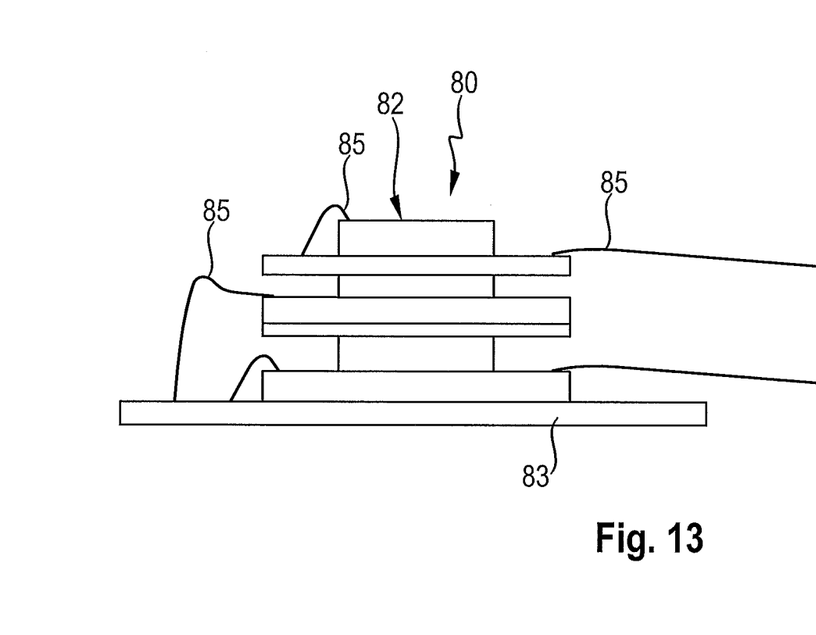
FIG. 13 is an illustration of a stacked die package including within package die-to-die and die-to external connection interconnect ribbon structures formed from dielectric and metal coated leads for improved thermal transfer performance.

As seen in FIG. 13, ribbon leads suitable for interconnecting semiconductor die packages 80 or extending between die within a package are of particular use in stacked die 82 embodiments. Die substrates 83 need for rerouting are typically formed from electrically insulative material that also has poor thermal conductivity. Using ribbon leads 85 formed from fused dielectric coated metal cores with a ground connectable outermost metallization layer, it is possible to remove heat from interior die, as well as transfer heat from a die to a substrate.

Figure 14:
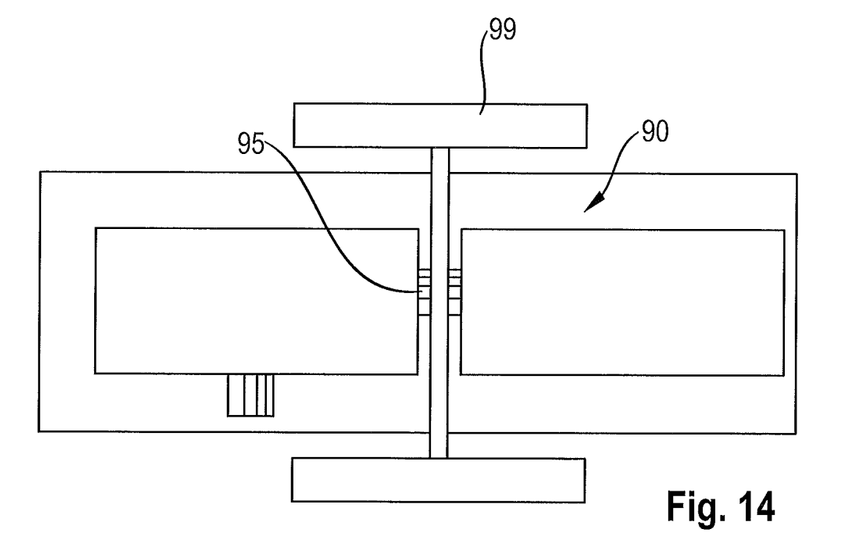
FIGS. 14 and 15 respectively illustrate in plan and side view package to package ribbon interconnect with transfer to an active or passive heat sink.
Figure 15:
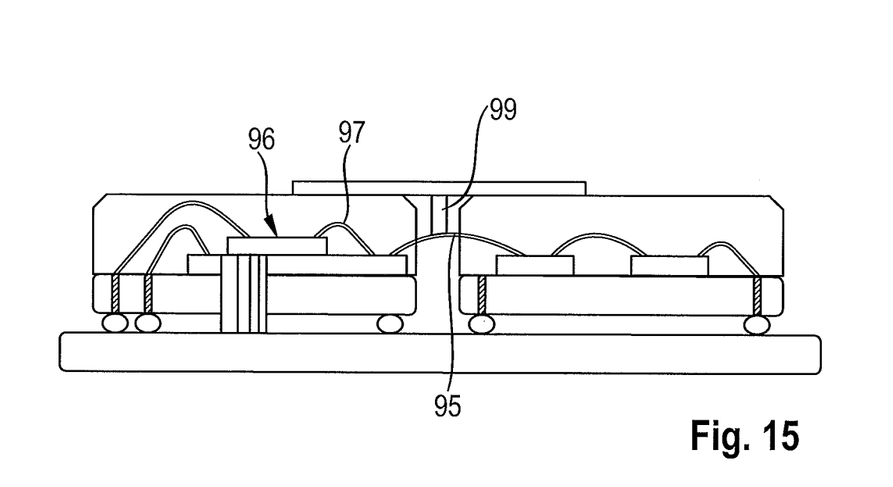

FIGS. 14 and 15 respectively illustrate in plan and side view a package-to-package connection 90 using a ribbon lead 95 such as discussed with respect to FIG. 12, as well as a die to die interconnection in a common mold package, and a die-to-substrate ribbon connection. As can be seen in FIG. 15, stacked packages 96 are also supported, with ribbons 97 extending between stacked die being shown. As seen in the FIGS. 14 and 15, the ribbon 95 interconnecting the packages is attached to a "winged" heat dissipating copper or aluminum sink or slug 99 to enhance heat transfer and dissipation. Active or passive air or liquid cooling can be used to remove heat from the winged slug if desired.

In at least some of the embodiments described above, electrical characteristics of the ribbon can be adjusted by having dielectric coated leads used in semiconductor die packaging formed to have varying dielectric thickness. Thick, thin, and intermediate thicknesses are possible by varying dielectric coating times and manufacture steps. Both the core diameter and the dielectric thickness can be varied. In certain embodiments the composition of the deposited dielectric can be also varied, with for example distinct dielectric materials surrounding a metal core and in turn be surrounded by a ground connectable metal coating. This allows, for example, a high performance dielectric having superior vapor barrier, oxygen degradation resistance, or the like, to be thinly deposited over a thick layer of a low cost dielectric material. In still other embodiments multiple layers of dielectric of varying thickness, can be separated by thin metal layers, with the outermost metal layer being connected to ground.

Generally, thin dielectric layers will provide low impedance good for power lines, thick dielectric layers are good for signal integrity, and outer metal layers are connected to the same ground. Note that a combination of core diameters and dielectric thicknesses is possible and a series of such steps may be performed to achieve more than two impedances. In certain embodiments it may be desirable to have large cores on power lines to increase power handling capacity, reduce power line temperatures, and/or further reduce any inductance on power supply and ground lines that would exacerbate ground bounce or power sag. Dielectric layers of intermediate thickness are also useful, since many packages could benefit from having leads of three (3) or more different dielectric thicknesses. For example, a lead has an intermediate dielectric thickness could be used to connect a source and load of substantially different impedance to maximize power transfer. For example, a 10 ohm source can be coupled to a 40 ohm load with a 20 ohm lead. Also, since cost of dielectric can be high, critical signal pathways can be interconnected using a thick dielectric, with less critical status, reset, or the like leads can be coated with a dielectric layer having a thickness greater than the power leads, but less than (intermediate) to the critical signal leads. Advantageously, this can reduce dielectric deposition material cost and time.

The precise thickness of the dielectric coating may be chosen, in combination with the wirebond diameter, to achieve a particular desired impedance value for each lead.

$$Z_0 = \sqrt{\frac{L}{C}} = \frac{138}{\sqrt{\varepsilon_r}} \cdot \log\left(\frac{b}{a}\right) \quad (1)$$

The characteristic impedance of a coax line is given in Eq. (1), where L is the inductance per unit length, C is the capacitance per unit length, a is the diameter of the bond wire, b is the outside diameter of the dielectric and $\varepsilon_r$ is relative permittivity of the coaxial dielectric.

Figure 5:
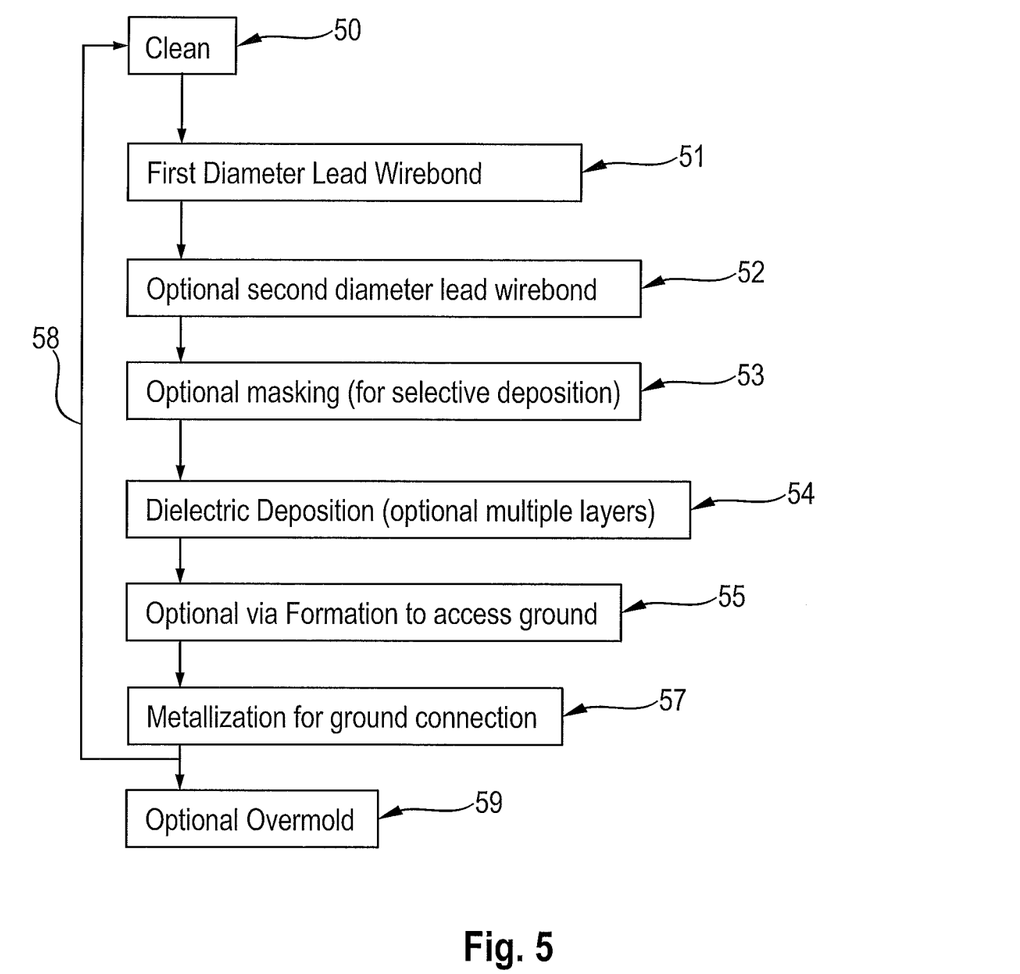
FIG. 5 illustrates method steps for manufacture of dielectric coated leads with outer ground connected metallization.
Figure 6:
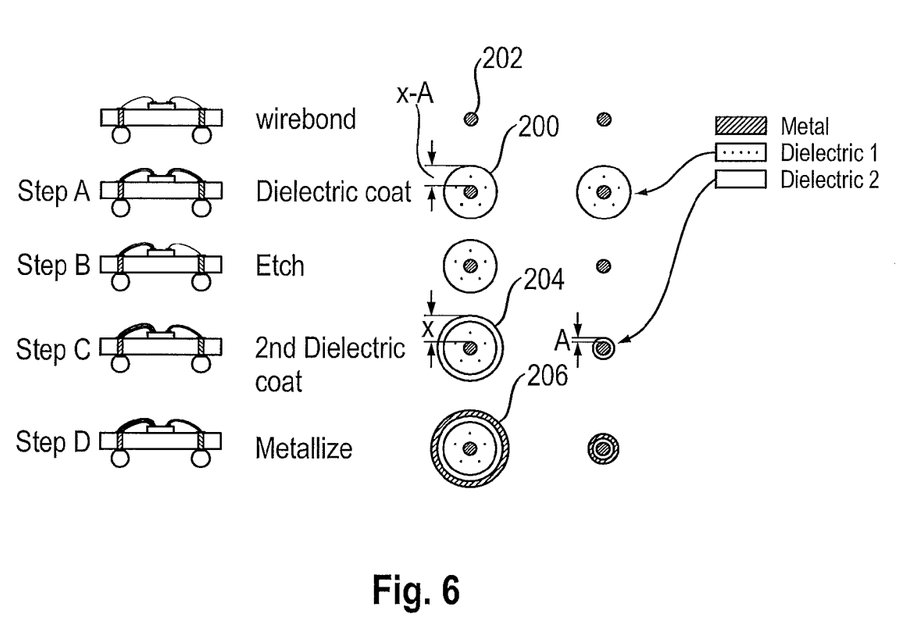
FIG. 6 illustrates a subtractive method for manufacture of dielectric coated leads with outer ground connected metallization.

As illustrated in FIG. 5, in one embodiment manufacture of dielectric coated leads with outer ground connected metallization can proceed using the following steps. Connection pads are cleaned (50) on the die and the substrate and a wirebonder is used to connect the die to the connection pads (51). Optionally, a second diameter wire can be attached (52) (e.g., a larger diameter wire suitable for power connections), or areas of the die can be masked (53) or otherwise protected to allow for selective deposition. One or more layers of dielectric of the same or different composition can be deposited (54), followed by selective laser or thermal ablation, or chemical removal of portions of the dielectric to allow access to ground connections covered in the dielectric deposition step (55). This step is optional, since in some embodiments, the need for a ground via can be eliminated. This is particularly true for die operating at higher frequencies, since a virtual RF ground may be established through capacitive coupling. Metallization (57) follows, covering the dielectric with a metal layer that forms the outermost metallized layer of the leads, and also connecting the leads to ground. The entire process can be repeated multiple times (58), useful for those embodiments using selective deposition techniques, and particularly for those embodiments supporting multiple die or complex and varied impedance leads. In the final step, for non-cavity packages, an overmold can be used to encapsulate leads (59).

In certain embodiments, modifications and additions to the described process are possible. For example, providing conformal coatings of dielectric can be accomplished through a variety of methods using chemical (electrophoretic), mechanical (surface tension), catalytic primer, electromagnetic [UV, IR], electron beam, or other suitable techniques. Electrophoretic polymers are particularly advantageous because they can rely on self-limiting reactions that can deposit precise thicknesses readily by adjusting process parameters and or simple additive, concentration, chemical, thermal, or timing changes to an electrophoretic coating solution.

In other embodiments, dielectric precoated bondwires can be used to form leads. While commercially available coated wires typically are thinner in dielectric thickness than is necessary to create, for example, 50 ohm leads, the foregoing discussed dielectric deposition steps can be used to increase dielectric thickness to set the desired impedance. Use of these precoated wires can simplify other process steps necessary to create coaxial lines, and can allow for thinner layers of needed vapor deposited dielectrics and faster processing times to create ground vias. Precoated bondwires can be used to prevent shorting for narrowly spaced or crossing leads. In certain embodiments the precoated bondwire can have a dielectric made from a photosensitive material to allow for selective patterning techniques.

In other embodiments, the dielectric Parylene™ can be used. Parylene™ is the trade name for a variety of chemical vapor deposited poly(p-xylylene)polymers used as moisture and dielectric barriers. Parylene™ can be formed in a growth limited condensation reaction using a modified Parylene™ deposition system where the die, substrate, and leads are aligned to a photoplate which allows EM radiation (IR, UV, or other) to strike in a precise manner causing selective growth rate of dielectric. Advantageously, this can minimize or eliminate the need for processes to create contact vias, bulk removal of Parylene™, etc.

Parylene™ and other dielectrics are known to suffer from degradation due to oxygen scission in the presence of oxygen, water vapor and heat. Damage can be limited by metal layers that form excellent oxygen vapor barriers, with thin layers of 3-5 micron thickness capable of forming true hermetic interfaces. Alternatively, if metal has been selectively removed, or not deposited in certain areas due to electrical, thermal, or manufacturing requirements, a wide range of polymer based vapor oxygen barriers can be used, with polyvinyl alcohol (PVA) being one widely used polymer. These polymers can be glob topped, screen printed, stenciled, gantry dispensed, sprayed onto Parylene™ surface that will be exposed to the oxygen or $H_2O$ vapor environment. Advantageously, use of vapor barrier polymers can be a part of a cost reduction strategy, since thicker layers of high cost Parylene™ or other oxygen sensitive material might otherwise be required.

As will be appreciated, all of the described method steps can benefit from various selective deposition techniques. Selective deposition can be by physical masking, directed polymer deposition, photoresist methods, or any other suitable method for ensuring differential deposition thickness on the metal core, dielectric layer, or other outermost layer at time of deposition. While selective deposition allows for additive methods to build leads, it also allows for subtractive techniques in which dielectric or metal is removed to form interconnects of differing impedances. For example, a package populated by one or more die can be wire-bonded as appropriate for interconnect of all package and device pads. As seen with respect to FIG. 6, which illustrate steps and structures for manufacture of a die package, the dielectric coating 200 can be deposited (Step A) to a thickness X-A over a wirebond metal conductor 202, where A is the thickness of the dielectric needed for the secondary interconnect impedance. The secondary impedance wirebond dielectrics can be removed (Step B) for example by an etch step, followed by a second coating 204 deposition (Step C) followed by metallization 206 of both interconnects (Step D). This subtractive process will create wirebonds of two distinct impedances.

Figure 7:
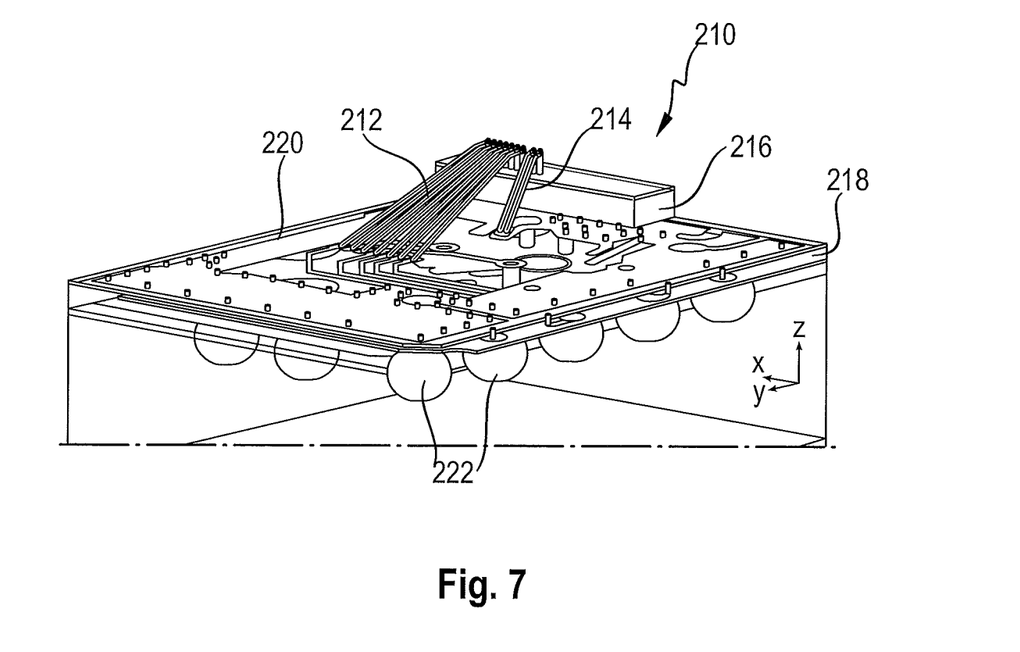
FIG. 7 illustrates a BGA package having dielectric coated leads with outer ground connected metallization.

In an embodiment illustrated with respect to FIG. 7, a ball grid array (BGA) package that includes dielectric and metal coated leads 212, 214 having partial or complete dielectric fusion of selected leads to improve mechanical characteristics or provide adequate electrical interconnections is described. Alternatively, the dielectric and metal coated leads 212, 214 are capable of being formed into partially metallized leads or through lines. Alternatively or additionally, the dielectric and metal coated leads 212, 214 are capable of supporting improved thermal transfer.

A BGA is a surface-mount packaging widely used for integrated circuits, and can generally provide more interconnection pins than dual in-line, leadframe, or other flat package since the entire bottom surface of the BGA can be used for connection pads. In many types of BGA packages, a die 216 is attached to a substrate 218 having fillable vias 220 connected to connection pads. Wirebonds 212, 214 can be used to connect the top side die 216 to the pads/vias 220, consequently providing electrical connections from a top side of the substrate to the bottom. In a BGA package, balls of solder 222 are attached to the bottom of the package and held in place with a tacky flux until soldering to a printed circuit board or other substrate. As described herein, the wirebonds of conventional BGA packages can be replaced with improved leads having a dielectric layer and an outer ground connectable metal layer. The leads can have varying dielectric thickness over an inner core and an outer metal layer, as well as being selectively optimized to have specific impedances, which can be selected to be different or well-matched based in part on dielectric layer thickness. As seen in the FIG. 7, both long 212 and short 214 leads are supported.

In more detail, assembly of an improved BGA package can require face up attachment of a die to a substrate supporting a connection pad formed adjacent and around a via in the substrate. This assembly is wirebonded as appropriate for each required interconnect, with a wirebond formed between a connection pad on the substrate and a connection pad on the die. Low frequency and power inputs are connected to the low frequency signal leads, while high-frequency inputs and outputs are connected to the high frequency signal leads. In some embodiments, the low frequency and power inputs can have a thickness that differs from high frequency signal leads. The assembly is then subjected to the coating of any essentially conformal dielectric material. Because of its low cost, ease of vacuum deposition, and superior performance characteristics, Parylene™ can be used. A small part of the dielectric layer near the leadframe attachment point can be selectively removed by etch, thermal degradation, or laser ablation, in order to form electrical connection to a ground contact point or ground shield layer. Similarly, a small portion of the dielectric layer is removed near the die connection pads to permit ground connections. Connection to ground in the structure follows from application of a metallized layer over the top of the dielectric layer, forming a ground shield. The thickness of the preferred metal layer should be chosen in consideration of skin depth and DC resistance issues, and should be composed primarily of an excellent electrical conductor such as silver, copper, or gold. For most applications, a 1 micron coating thickness is adequate for functionality, but thicker coatings can help minimize cross-talk between leads. These coatings may be added in defined areas through a combination of lithography or other masking methods, and plating or other selective deposition methods. The package can be completed by placement of an overmold or lid over the die, followed by dicing (singulation) and testing.

Figure 8:
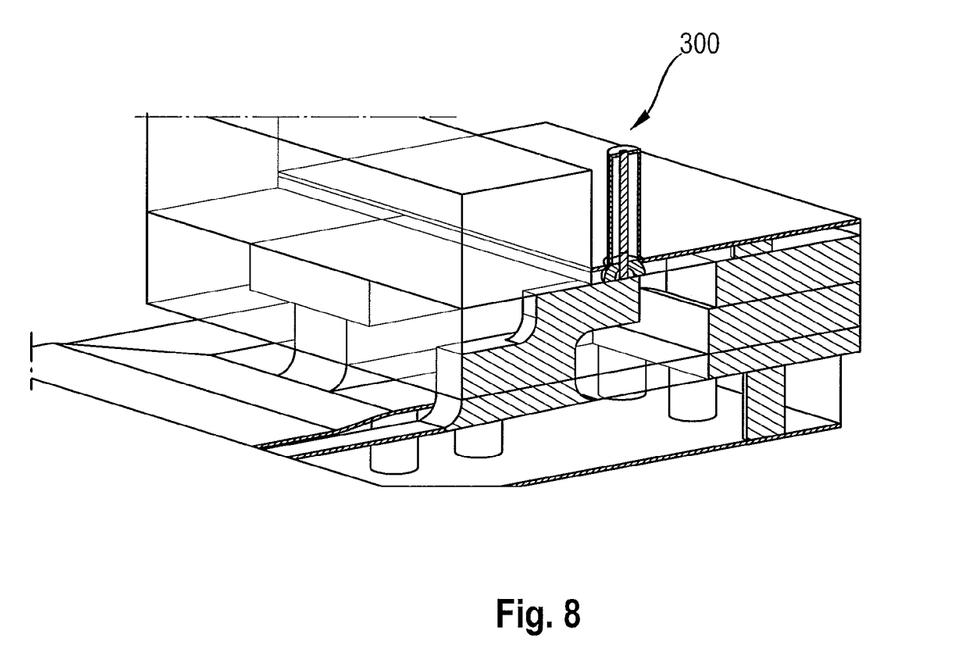
FIG. 8 illustrates a portion of leadframe package having dielectric coated leads with outer ground connected metallization.

Alternatively, in an embodiment illustrated with respect to FIG. 8, low cost leadframe based die package 300 including wire bonds extending from the die to a leadframe can be manufactured by forming a leadframe strip containing a two-dimensional array of individual package sites and outside frame portion. Leadframe fabrication is conventional, and can include formation of separate leads through etching, stamping, or electrodeposition. The leadframe strip can be placed in a mold including, but not limited to, an injection molding or transfer molding apparatus. An appropriate dielectric material, preferably plastic such as commercially available epoxy mold compound, is injected, pumped or otherwise transferred into the mold to achieve a leadframe/mold material composite structure. The properties of the mold material are important for their dielectric constant, loss tangent, and electrically dispersive properties as well as their temperature, moisture, and other mechanical performance attributes.

Each package site on the resulting composite leadframe strip is cleaned of mold release material and or mold-flash, and prepared for deposition of a metal finish over the exposed metal portions of the leadframe. This may be accomplished through plating techniques such as immersion or electroplating, and the metals would be chosen for corrosion suppression and ease of wirebonding. An example of such finishing is a thin layer of nickel (for protection) followed by a layer of gold (added protection and ability to wirebond). Each package site of the resultant molded leadframe strip can then be populated with the required die, which are attached to the base, with die attach material being chosen for mechanical and thermal properties for a particular packaging application. The resultant assembly is then wirebonded as appropriate for each required interconnect, with a wirebond formed between a lead on the leadframe and a connection pad on the die. Low frequency and power inputs are connected to the low frequency signal leads, while high-frequency inputs and outputs are connected to the high frequency signal leads. In some embodiments, the low frequency and power inputs can have a thickness that differs from high frequency signal leads Like the foregoing described BGA package 210, the populated leadframe strip is then subjected to the coating of any essentially conformal dielectric material including Parylene™. In the case of Parylene™, it may be preferable to mask the bottom of the packages with tape, such as a vacuum-compatible polyimide with acrylic adhesive, or similar material to prevent deposition onto the area of the leads that will eventually be attached to the PCB. This will facilitate easier soldering at a subsequent step. A small part of the dielectric layer near the leadframe attachment point is selectively removed by etch, thermal degradation, or laser ablation, in order to form electrical connection to a ground contact point or ground shield layer. Similarly, a small portion of the dielectric layer is removed near the die connection pads to permit ground connections. Connection to ground in the structure follows from application of a metallized layer over the top of the dielectric layer, forming a ground shield. The thickness of the preferred metal layer should be chosen in consideration of skin depth and DC resistance issues, and should be composed primarily of an excellent electrical conductor such as silver, copper, or gold. For most applications, a 1 micron coating thickness is adequate for functionality, but thicker coatings can help minimize cross-talk between leads. These coatings may be added in defined areas through a combination of lithography or other masking methods, and plating or other selective deposition methods. The package is completed by placement of an overmold or lid over the die, followed by dicing (singulation) and testing.

Example 1

Use of one or more leads for in-package heat transfer from die to a substrate or heat transfer structure is illustrated in the figures. As illustrated, single or ribbon leads in accordance with the disclosure can be used to transfer heat from stacked die.

In particular, the present invention is directed to a multi-die interconnect system, comprising a first and a second die, with each die respectively having a plurality of connection pads, and a ribbon lead extending from a first die to the second die, the ribbon lead having a plurality of metal cores with a core diameter, and a dielectric layer surrounding the metal core with a dielectric thickness, with at least a portion of dielectric being fused between adjacent metal cores along the length of the plurality of metal cores, and an outer metal layer attached to ground.

Further, the present invention relates to a through line interconnect system, comprising a first die having a plurality of connection pads, and a package substrate having a plurality of connection pads, and a ribbon lead extending from a package substrate to the first die, the ribbon lead having a plurality of metal cores with a core diameter, and a dielectric layer surrounding the metal core with a dielectric thickness, with at least a portion of dielectric being fused between adjacent metal cores along the length of the plurality of metal cores, and an outer metal layer only partially covering the fused dielectric and attached to ground.

Further, the present invention relates to a through line interconnect system, comprising a first and a second die, with each die respectively having a plurality of connection pads, and a ribbon lead extending from the first die to the second die, the ribbon lead having a plurality of metal cores with a core diameter, and a dielectric layer surrounding the metal core with a dielectric thickness, with at least a portion of dielectric being fused between adjacent metal cores along the length of the plurality of metal cores, and an outer metal layer only partially covering the fused dielectric and attached to ground.

Further, the present invention relates to the following: a die package to die package, a stacked die package, a BGA package, a leadframe package, a die to die connection in a common package, a packaged die to substrate, a large pitch to small pitch interconnect with fan-in, a large die to small die interconnect with fan-in, a large pitch to small pitch partial through line, and a die to antenna launch structure.

Further, the present invention relates to a multi-die interconnect system, comprising a first and a second die, with each a die respectively having a plurality of connection pads, and a lead extending from a first die to the second die, the lead having a plurality of metal cores with a core diameter, and a dielectric layer surrounding the metal core with a dielectric thickness, with at least a portion of dielectric being fused between adjacent metal cores along the length of the plurality of metal cores, and an outer metal layer attached to ground and exposed to ambient conditions to facilitate heat transfer.

Further, the present invention relates to a die package to die package, a stacked die package, a BGA package, a leadframe package, a die to die connection in a common package, a packaged die to substrate connection, a heat sink or slug connection, a fluid cooling, direct or with a heat sink, and to a ribbon head.

Further, the present invention is directed to a thermal transfer system for packaged die, comprising a die having a plurality of connection pads, and a lead extending from a first die to a heat sink, the lead having a plurality of metal cores with a core diameter, and a dielectric layer surrounding the metal core with a dielectric thickness, with at least a portion of dielectric being fused between adjacent metal cores along the length of the plurality of metal cores, and an outer metal layer attached to ground.

Finally, the present invention is directed to a stacked die, a heat sink in the form of a substrate, an adhesive layer, a thermally conductive paste, a metal slug, a device for in package heat transfer, and to a ribbon lead.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An interconnect system, comprising
   a first die having a plurality of connection pads, and
   a ribbon lead having a plurality of metal cores with a core diameter, and a dielectric layer surrounding the metal core with a dielectric thickness, with at least a portion of dielectric being fused between adjacent metal cores along the length of the plurality of metal cores, and an outer metal layer attached to ground,
   wherein the interconnect system is a multi-die interconnect system comprising the first die and a second die, with each die respectively having a plurality of connection pads, the ribbon lead extending from the first die to the second die.

2. The interconnect system comprising:
   a first die having a plurality of connection pads, and
   a ribbon lead having a plurality of metal cores with a core diameter, and a dielectric layer surrounding the metal core with a dielectric thickness, with at least a portion of dielectric being fused between adjacent metal cores along the length of the plurality of metal cores, and an outer metal layer attached to ground,
   wherein the interconnect system is a through line interconnect system comprising the first die and a second die, with each die respectively having a plurality of connection pads, the ribbon lead extending from the first die to the second die.

3. The interconnect system of claim 1, wherein the outer metal layer covers the fused dielectric only partially.

4. The interconnect system of claim 1, wherein the dielectric is completely or alternatively only partially fused along the length of the lead.

5. The interconnect system of claim 1, wherein the second die is smaller than the first die, wherein only a limited length of the lead near the smaller die has fused dielectric.

6. The interconnect system of claim 1, including at least one preferably stacked die with a first die and a second die, the ribbon lead extending from the first die to the second die, from the first die to another die not being part of the stacked die and/or to a die substrate.

7. The interconnect system of claim 1, including a first die package and a second die package, the ribbon lead extending from the first die package to the second die package.

8. The interconnect system of claim 1, including at least one active or passive element like an antenna or an antenna system, the ribbon lead extending from the first die to the active and/or passive element.

9. The interconnect system of claim 1 in the form of a large die-to-small die interconnect structure, with one or more leads forming a ribbon lead for at least a portion of their length.

10. The interconnect system of claim 1, wherein the dielectric layer surrounding a first core has a first thickness and the dielectric layer surrounding a second core has a second thickness differing from the first thickness.

11. The interconnect system of claim 1, wherein the outer metal layer is exposed to ambient conditions to facilitate heat transfer.

12. The interconnect system of claim 1, wherein the lead is convectively or contact cooled by an active and/or passive heat sink like moving air or liquid, high thermal conductivity metal, thermal pastes or thermally transmissive adhesives, and/or active cooling agents such as piezoelectric coolers.

13. The interconnect system of claim 1, wherein the lead extends from the first die to a heat sink.

14. The interconnect system of claim 1 adapted for a ball grid array (BGA) package.

15. The interconnect system of claim 1 adapted for a leadframe package.

16. The interconnect system of claim 1 operational within a thermal transfer system for a packaged die, the lead extending from the first die to a heat sink.

17. The interconnect system of claim 16, wherein the heat sink is a substrate, an adhesive layer, a thermally conductive past and/or a metal slug.

18. The interconnect system of claim 5, including at least one preferably stacked die with a first die and a second die, the ribbon lead extending from the first die to the second die, from the first die to another die not being part of the stacked die and/or to a die substrate.

* * * * *